(12) United States Patent
Sun

(10) Patent No.: US 10,741,549 B2
(45) Date of Patent: Aug. 11, 2020

(54) FINFET DEVICE INTEGRATED WITH TFET AND MANUFACTURING METHOD THEREOF

(71) Applicants: SHANGHAI IC R&D CENTER CO., LTD., Shanghai (CN); CHENGDU IMAGE DESIGN TECHNOLOGY CO. LTD., Chengdu (CN)

(72) Inventor: Deming Sun, Shanghai (CN)

(73) Assignees: SHANGHAI IC R&D CENTER CO., LTD, Shanghai (CN); CHENGDU IMAGE DESIGN TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 16/465,200

(22) PCT Filed: Nov. 22, 2017

(86) PCT No.: PCT/CN2017/112354
§ 371 (c)(1),
(2) Date: May 30, 2019

(87) PCT Pub. No.: WO2018/099306
PCT Pub. Date: Jun. 7, 2018

(65) Prior Publication Data
US 2020/0006326 A1   Jan. 2, 2020

(30) Foreign Application Priority Data

Nov. 30, 2016  (CN) .......................... 2016 1 1077082

(51) Int. Cl.
*H01L 27/07* (2006.01)
*H01L 21/266* (2006.01)
(Continued)

(52) U.S. Cl.
CPC ........ *H01L 27/0705* (2013.01); *H01L 21/266* (2013.01); *H01L 21/823431* (2013.01); *H01L 29/7391* (2013.01); *H01L 29/785* (2013.01)

(58) Field of Classification Search
CPC .............. H01L 27/0886; H01L 29/785; H01L 29/66795; H01L 21/823431; H01L 21/266; H01L 29/7833
See application file for complete search history.

(56) References Cited

U.S. PATENT DOCUMENTS

2010/0200916 A1* 8/2010 Gossner ................ H01L 29/165
257/335
2015/0364582 A1* 12/2015 Goto .................... H01L 29/7391
257/12
(Continued)

*Primary Examiner* — Changhyun Yi
(74) *Attorney, Agent, or Firm* — Tianchen LLC; Yuan R. Li; Yi Fan Yin

(57) ABSTRACT

The present disclosure provides a FINFET device integrated with a TFET and its manufacturing method. Two end portions of the fin structure respectively form an N-type doped drain and a source which is consisted by a top P-type doped region and a bottom N-type doped region. As a result, the bottom N-type doped region of the source, the drain, the channel, the high-k dielectric layer and the gate structure on the surface of the sidewall of the fin structure form a MOS FINFET device, and the top P-type doped region of the source, the drain, the channel, the high-k dielectric layer and the gate structure on the top surface of the fin structure form the TFET device. The integration of the TFET and the FINFET is achieved, which decreases the cost.

10 Claims, 6 Drawing Sheets

(51) Int. Cl.
*H01L 21/8234* (2006.01)
*H01L 29/739* (2006.01)
*H01L 29/78* (2006.01)

(56) References Cited

U.S. PATENT DOCUMENTS

2016/0322479 A1* 11/2016 Liu .................... H01L 29/516
2020/0119176 A1* 4/2020 Dasgupta .......... H01L 29/66462

* cited by examiner

FINFET DEVICE INTEGRATED WITH TFET AND MANUFACTURING METHOD THEREOF

CROSS-REFERENCE TO RELATED APPLICATIONS

This application claims priority of International Patent Application Serial No. PCT/CN2017/112354, filed Nov. 22, 2017, which is related to and claims priority of Chinese patent application Serial No. 201611077082.5, filed Nov. 30, 2016. The entirety of each of the above-mentioned patent applications is hereby incorporated herein by reference and made a part of this specification.

TECHNICAL FIELD

The present disclosure generally relates to the field of integrated circuit technology, more particularly, to a FINFET device integrated with a TFET and its manufacturing method.

BACKGROUND

Tunnel field-effect transistors (TFETs) can be used under supply voltages enabled by the low subthreshold swing (SS) which is less than 60 mV/dec. Due to the low subthreshold swing, the on/off threshold voltage is low, accordingly the on/off speed increases and the energy consumption decreases. Therefore, the TFET is also called green FET (GFET). However, the TFET has the disadvantage of low drive current when turned-on. By forming a p-type heavily doped layer on the top of the source end of a FINFET structure, a TFET parallel connected to the double-gated MOSFET having channels at two sidewalls of the fin is formed. The TFET dominates the subthreshold current of the device operated in subthreshold region. Thus, the subthreshold swing is low. When turned on, the double-gated MOSFET dominates the on current of the device to avoid the weakness of the TFET. As shown in FIG. 9, which is a view showing the current-voltage curves of the MOSFET and the TFET, the subthreshold swing of the MOSFET is larger than that of the TFET, the saturation current is higher than that of the TFET. Comparing with the MOSFET, the subthreshold swing of the TFET is small, and the saturation current is low. When the combined structure of TFET and the MOSFET charges to an electrode, the charging current increases more quickly than a conventional MOSFET, due to the introduction of the TFET. As shown in FIG. 9, the on/off speed of the TFET is higher than the on/off speed of the conventional MOSFET on fin structure

SUMMARY

Accordingly, an objective of the present disclosure is to provide a FINFET device integrated with a TFET and its manufacturing method.

To achieve the above purposes, the present disclosure provides a FINFET device integrated with a TFET comprising:

a fin structure formed on a semiconductor substrate;

a source and a drain formed at two end portions of the fin structure; wherein the drain is N-type doped, the source comprises a bottom N-type doped region and a top P-type doped region;

an oxide layer and a high-k dielectric layer subsequently formed on top and side surfaces of the fin structure between the source and the drain;

a gate structure formed on the high-k dielectric layer;

a channel formed in the fin structure between the source and the drain below the high-k dielectric layer, wherein, the bottom N-type doped region of the source, the drain, the channel, the high-k dielectric layer and the gate structure on the surface of the sidewall of the fin structure form a MOS FINFET device; the top P-type doped region of the source, the drain, the channel, the high-k dielectric layer and the gate structure on the top surface of the fin structure form a TFET device.

Preferably, the gate structure is made of a conductive metal.

Preferably, the work function of the conductive metal is between 2 eV and 5 eV.

Preferably, a width of the fin structure is between 5 nm and 20 nm.

Preferably, a ratio of a thickness of the top P-type doped region and a thickness of the bottom N-type doped region is between 1:2 and 1:5.

To achieve the above purposes, the present disclosure also provides a manufacturing method for the above FINFET device integrated with a TFET. The manufacturing method comprises the following steps:

S01: forming a fin structure on a semiconductor substrate;

S02: forming an oxide layer and a polysilicon gate structure on the fin structure; wherein the polysilicon gate structure and the oxide layer have the same pattern as a high-k dielectric layer to be formed later;

S03: performing N-type ion implanting to two end portions of the fin structure to from an N-type doped drain and an N-type doped source;

S04: forming a mask covering the semiconductor substrate outside the N-type doped source and performing P-type ion implanting to the N-type doped source to form a top P-type doped region, wherein the other N-type doped source below the P-type doped region forms a bottom N-type doped region;

S05: removing the polysilicon gate structure;

S06: forming a high-k dielectric material and a gate material on the fin structure and patterning the high-k dielectric material and the gate material to form the high-k dielectric layer and the gate structure.

Preferably, during the P-type ion implanting, ions are implanted to the source from all sides above the source. In step S04, an angle between a direction of the ion implanting and a horizontal direction is greater than an arctan of a total thickness of the oxide layer, the high-k dielectric layer, the gate structure and a lateral length of the source.

Preferably, the angle between the direction of the P-type ion implanting and the horizontal direction is greater than 45°.

Preferably, a ratio of a thickness of the top P-type doped region and a thickness of the bottom N-type doped region is between 1:2 and 1:5.

According to the present disclosure, the FINFET device is integrated with a TFET, two end portions of the fin structure respectively form an N-type doped drain and a source which is consisted by a top P-type doped region and a bottom N-type doped region. As a result, the bottom N-type doped region of the source, the drain, the channel, the high-k dielectric layer and the gate structure on the surface of the sidewall of the fin structure form a MOS FINFET device, and the top P-type doped region of the source, the drain, the channel, the high-k dielectric layer and the gate structure on the top surface of the fin structure form the TFET device. Therefore, the TFET is integrated with the FINFET, which decreases the cost.

DETAILED DESCRIPTION

The present disclosure will now be descried more fully hereinafter with reference to the accompanying drawings. It will be understood that various changes in form and details may be made herein without departing from the spirit and scope of the invention; and the embodiments and drawings are substantially used for illustrating the invention and should not be used as limitation to the present disclosure.

The present disclosure will now be descried more fully hereinafter with reference to FIG. 1-FIG. 8. It should be noted that the drawings are not necessarily to scale, emphasis instead being placed upon illustrating the principles of the present disclosure.

Figure 1A:
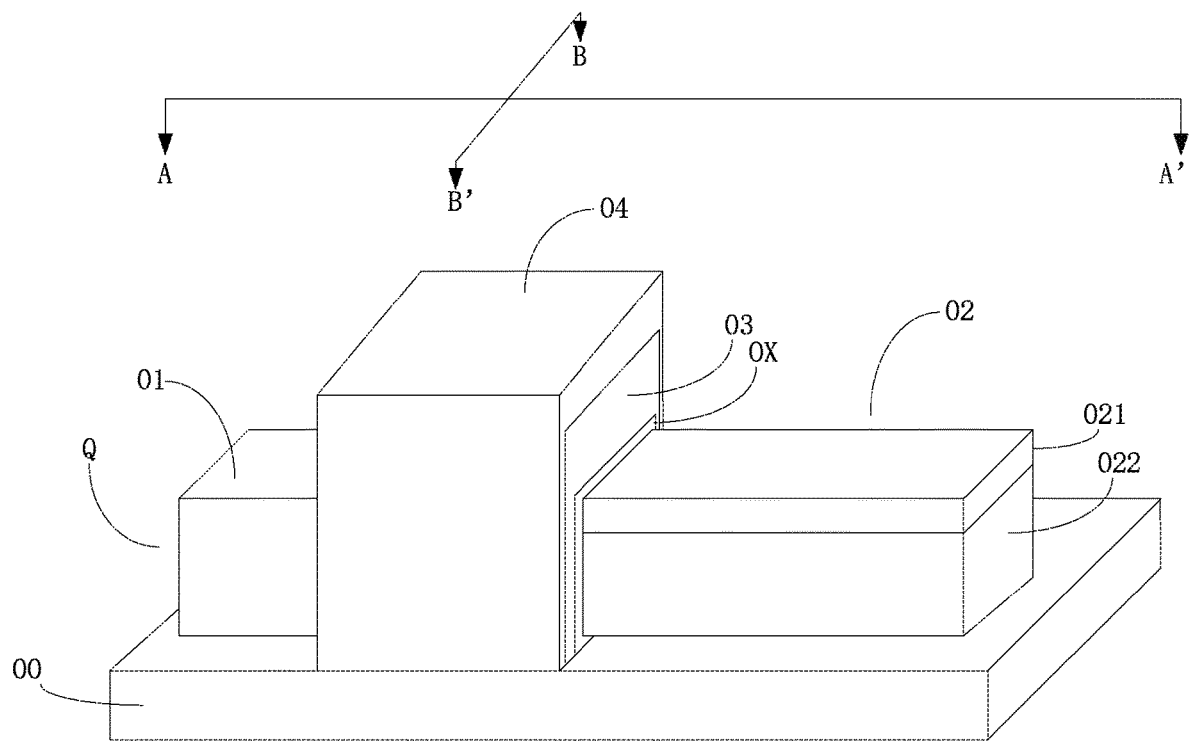
FIG. 1 is a view of a FINFET device integrated with a TFET according to a preferred embodiment of the present disclosure.
Figure 1B:
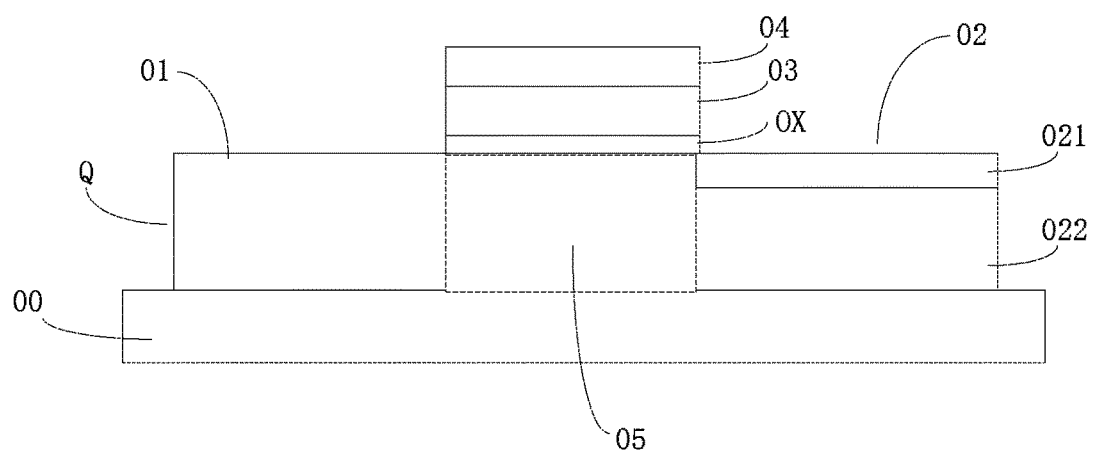
Figure 1C:
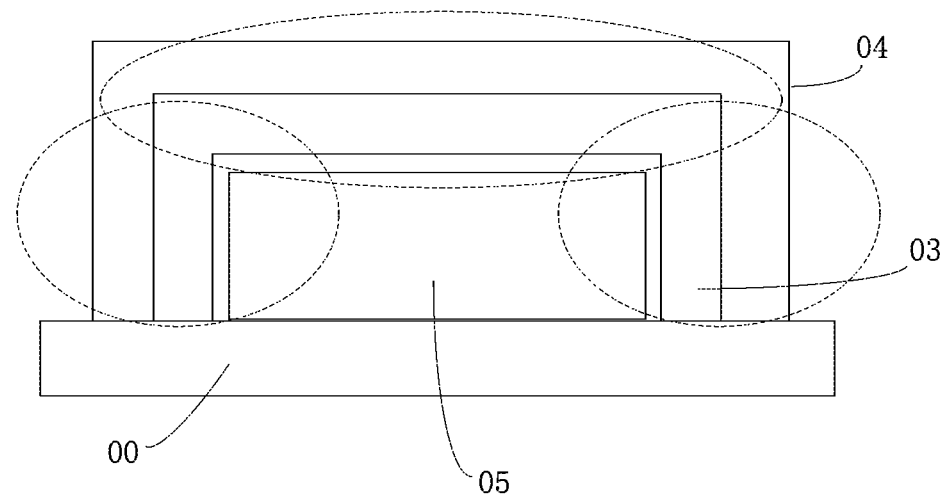
Figure 2:
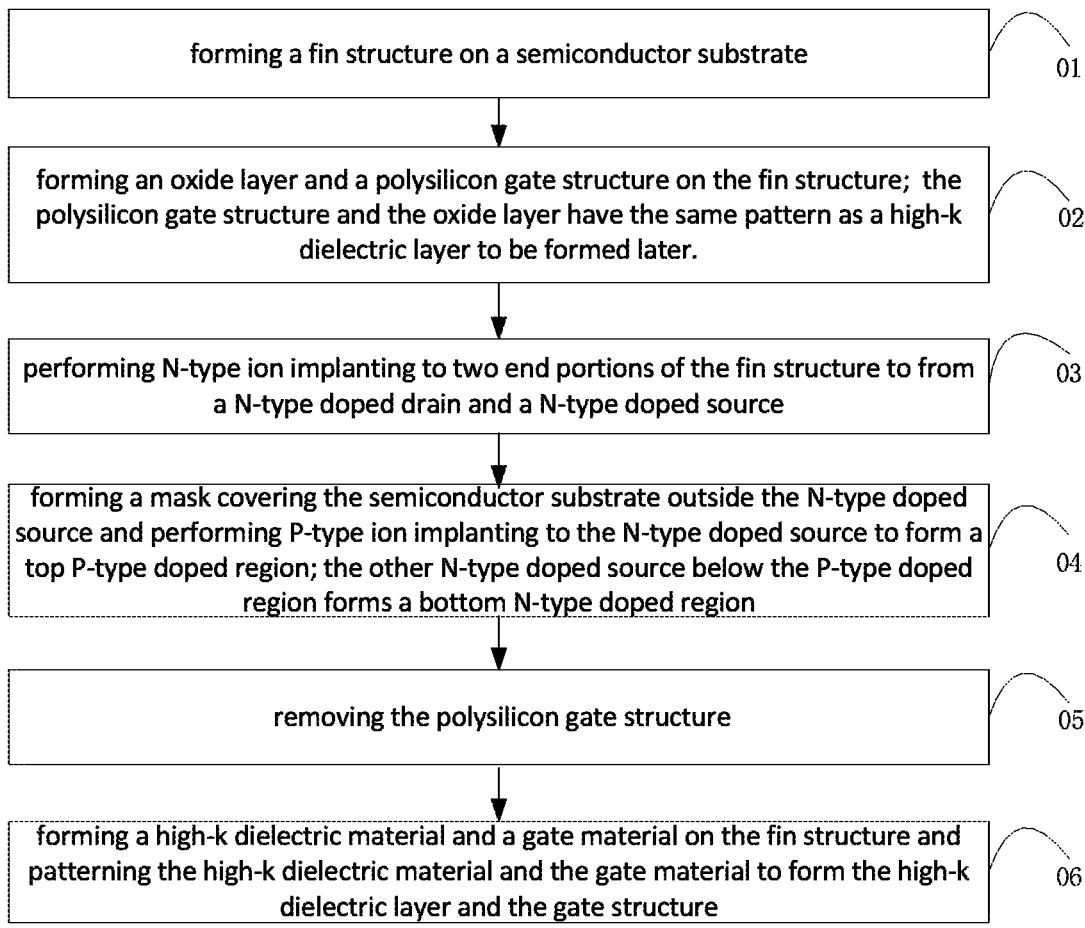
FIG. 2 is a flow chart of the manufacturing method for the FINFET device integrated with the TFET according to a preferred embodiment of the present disclosure.

Referring to FIG. 1a, FIG. 1b, and FIG. 1c, FIG. 1a is a stereogram of the structure of the FINFET device, FIG. 1b is a sectional view of the structure along a direction AA' in FIG. 1a, FIG. 1c is a sectional view of the structure along a direction BB' in FIG. 1a. In the embodiment, the FINFET device integrated with a TFET comprises:

A fin structure Q formed on a semiconductor substrate 00. The semiconductor substrate 00 can be a silicon substrate, but not limited thereto. The fin structure Q may have a width between 5 nm to 20 nm;

A source 02 and a drain 01 at two end portions of the fin structure Q. The whole drain 01 is N-type doped. The source 02 comprises a bottom N-type doped region 022 and a top P-type doped region 021. A ratio of a thickness of the top P-type doped region 021 and a thickness of the bottom N-type doped region 022 may be between 1:2 and 1:5.

An oxide layer OX and a high-k dielectric layer 03 which are subsequently formed on top and side surfaces of the fin structure Q between the source 02 and the drain 01.

A gate structure 04 formed on the high-k dielectric layer 03. The gate structure 04 can be made of a conductive metal. The work function of the conductive material can be between 2 eV and 5 eV and is preferably to be 4.74 eV.

As shown in FIG. 1b, a channel 05 is formed in the fin structure Q between the source 02 and the drain 01 below the high-k dielectric layer 03. The channel 05 is N-type doped with a concentration between $1E17/cm^3$ and $2E19/cm^3$. Preferably, the channel has a doping concentration of $3E18/cm^3$.

Please referring to FIG. 1a, FIG. 1b and FIG. 1c, the bottom N-type doped region 022 of the source 02, the drain 01, the channel 05, the high-k dielectric layer 03 and the gate structure 04 on the side surfaces of the fin structure Q form a MOS FINFET device, as shown by the dotted box at two sides of the channel 05.

The top P-type doped region 021 of the source 02, the drain 01, the channel 05, the high-k dielectric layer 03 and the gate structure 04 on the top surface of the fin structure Q form a TFET device, as shown by the dotted box above the channel 05. Therefore, the integration of the TFET and the FINFET is achieved.

Figure 3:
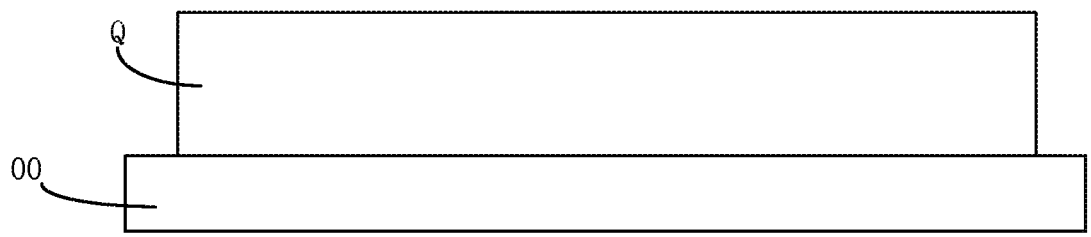
FIG. 3 to FIG. 8 are views showing specific processing steps of the manufacturing method for the FINFET device integrated with the TFET according to a preferred embodiment of the present disclosure.

As shown in FIG. 2 to FIG. 8, the present disclosure also provides a manufacturing method for the FINFET device integrated with a TFET. FIG. 3 to FIG. 8 are sectional views of the structure along a direction AA' in FIG. 1a after specific processing steps of the manufacturing method. The manufacturing method comprises the following steps:

S01, as shown in FIG. 3, forming a fin structure Q on a semiconductor substrate 00.

Specifically, the fin structure Q can be formed by lithography and etching processes, but not limited thereto.

Figure 4:
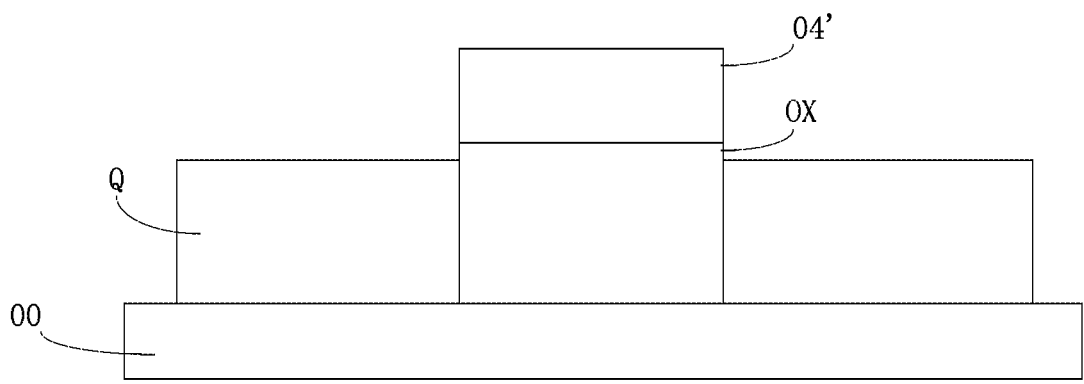

S02: as shown in FIG. 4, forming an oxide layer OX and a polysilicon gate structure 04' on the fin structure Q; wherein the polysilicon gate structure 04' and the oxide layer OX have the same pattern as a high-k dielectric layer to be formed later.

Specifically, an oxide material and a polysilicon gate material are deposited on the semiconductor substrate 00 with the fin structure Q successively and then patterned to form the oxide layer OX and the polysilicon gate structure 04'.

Figure 5:
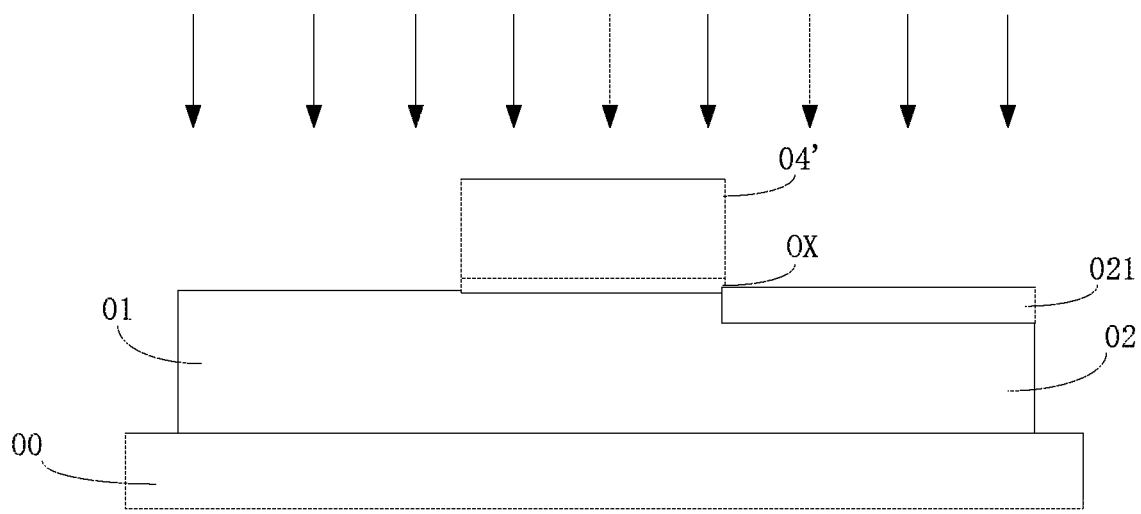

S03: as shown in FIG. 5, performing N-type ion implanting to two end portions of the fin structure Q to from a N-type doped drain 01 and a N-type doped source 02.

Specifically, under the coverage of the oxide layer OX and the polysilicon gate structure 04', the two end portions of the fin structure Q are N-type ion implanted, while the portion of the fin structure Q covered by the oxide layer OX is not ion implanted.

S04: as shown in FIG. 6, forming a mask covering the semiconductor substrate 00 outside the N-type doped source 02 and performing P-type ion implanting to the N-type doped source 02 to form a top P-type doped region 021, wherein the other N-type doped source 02 below the P-type doped region 021 forms a bottom N-type doped region 022.

Figure 6A:
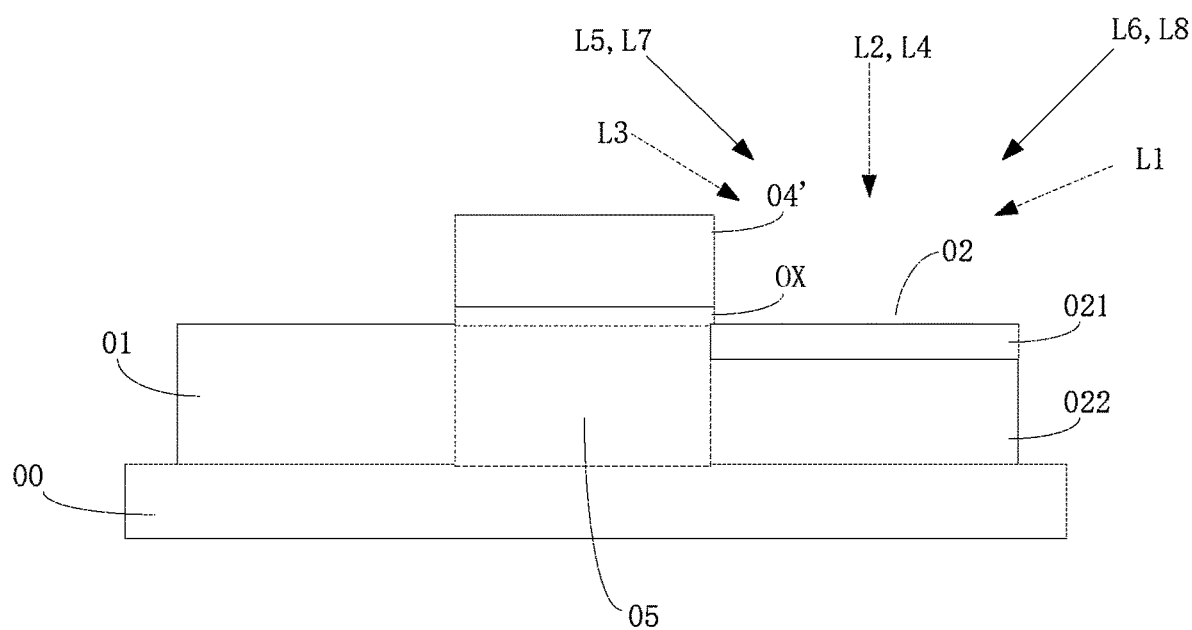
Figure 6B:
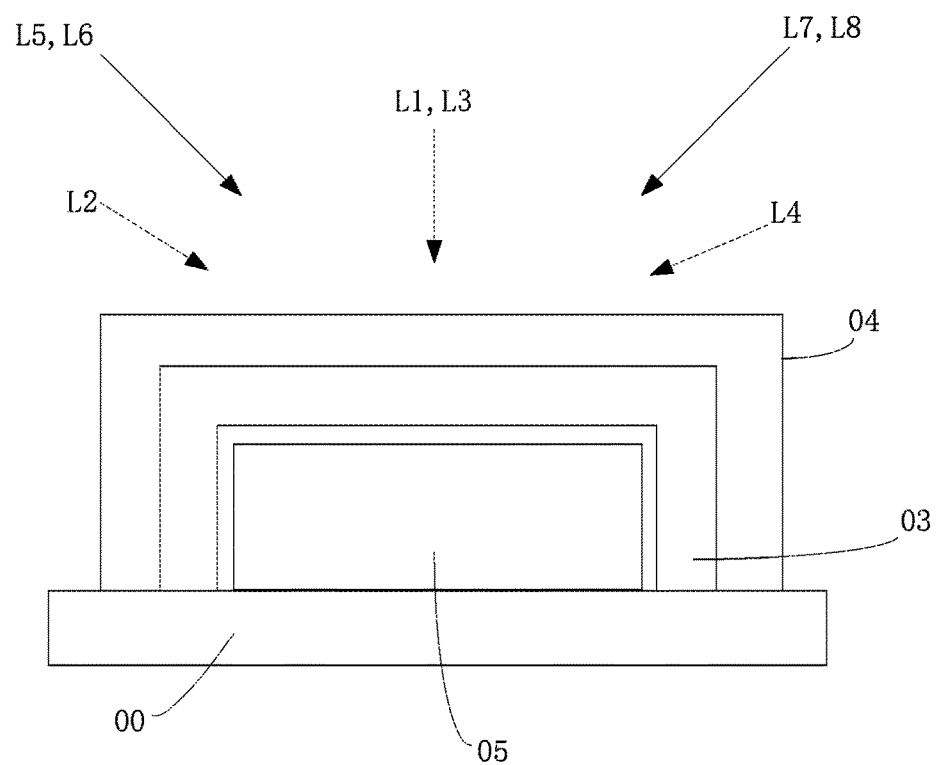

Specifically, the mask can be a photoresist, which is not limited thereto. A lithography process is performed to form an opening in the photoresist to expose the source and cover the other areas. Preferably, during the P-type ion implanting, an angle between a direction of the ion implanting and a horizontal direction is greater than an arctan of a total thickness of the oxide layer, the high-k dielectric layer, the gate structure and a lateral length of the source. Preferably, the angle between the direction of the P-type ion implanting and the horizontal direction is greater than 45°, such that ions can be implanted simultaneously to the source from all sides above the source. For example, ions can be implanted from four corners above the source, or from four corners and middle of four sides above the source. FIG. 6a is a sectional view of the structure along the direction AA' in FIG. 1a corresponding to the processing step S04, FIG. 6b is a sectional view of the structure along the direction BB' in FIG. 1a corresponding to the processing step S04. The solid arrows represent four corners above the source, wherein, arrows L5, L6, L7, L8 are sequentially arranged clockwise or anticlockwise in a same conical surface, the conical surface is formed by rotating one of the arrows around a vertical line. The dashed arrows represent middle of four sides above the source, wherein, arrows L1, L2, L3, L4 are sequentially arranged clockwise or anticlockwise in a same conical surface, the conical surface is formed by rotating one of the arrows around a vertical line. Furthermore, the conical surface having the arrows L5, L6, L7, L8 and the conical surface having the arrows L1, L2, L3, L4 can be overlapped, such that the angles between the direction of the ion implanting represented by the arrows L1, L2, L3, IA, L5, L6, L7, L8 and the vertical line are the same, the P-type ions can be implanted more uniformly. It is noted that, the implanting direction shown in FIG. 6a and FIG. 6b are illustrative, in the embodiment, the P-type ions can be implanted from any location above the source as long as the implantation path do not interfere from each other. After the P-type ion implantation, an N-type channel is formed in the fin structure below the oxide layer and the polysilicon gate structure.

Figure 7:
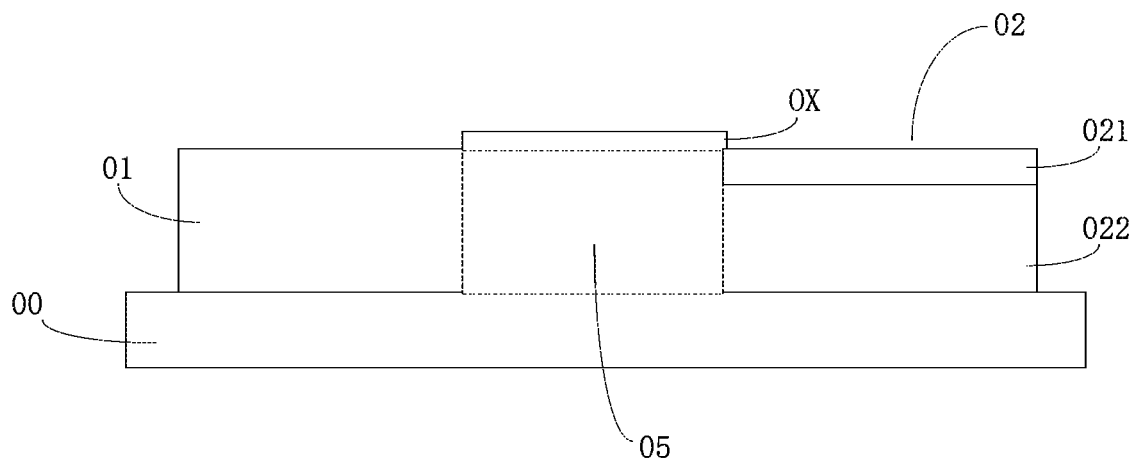

S05: as shown in FIG. 7, removing the polysilicon gate structure 04'.

Specifically, the polysilicon gate structure 04' is removed by a chemical etching process, but not limited thereto.

Figure 8:
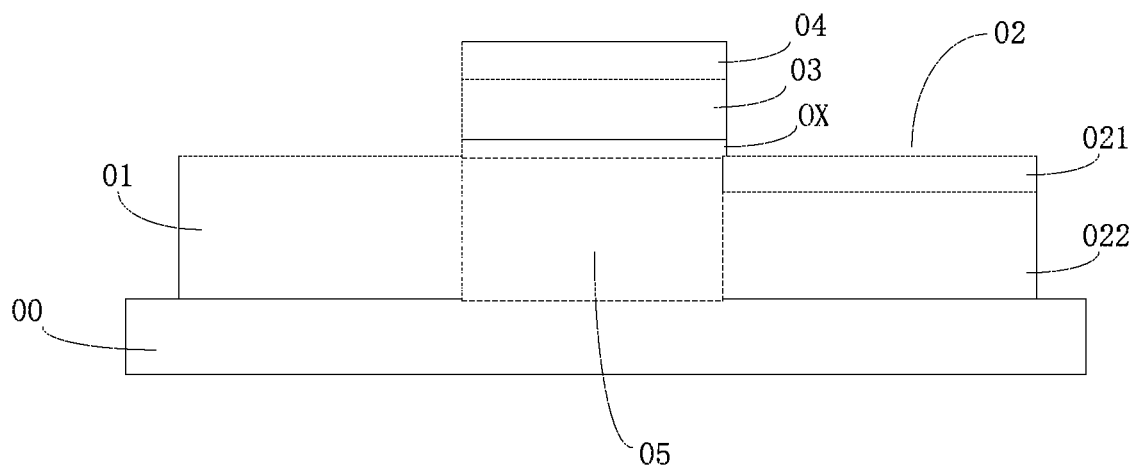
Figure 9:
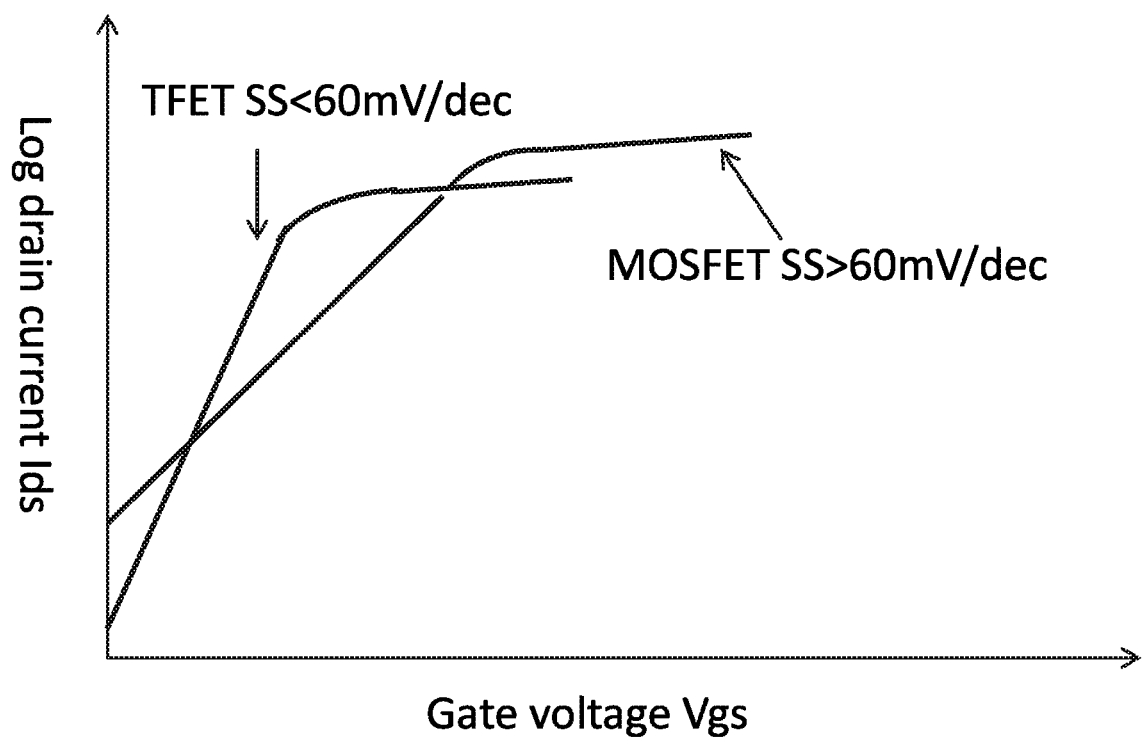
FIG. 9 is a view showing current-voltage curves of the MOSFET and the TFET.

S06: as shown in FIG. 8, forming a high-k dielectric material and a gate material on the fin structure and patterning the high-k dielectric material and the gate material to form the high-k dielectric layer 03 and the gate structure 04.

Specifically, firstly the high-k dielectric material is deposited by a CVD process but not limited thereto, then a metal gate material is deposited by a PVD process. After that, lithographic and etching processes are performed to the high-k dielectric material and the gate material to form the high-k dielectric layer 03 and the gate structure 04.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A FINFET device integrated with a TFET comprising:
    a fin structure formed on a semiconductor substrate;
    a source and a drain formed at two end portions of the fin structure; wherein the drain is N-type doped, the source comprises a bottom N-type doped region and a top P-type doped region;
    an oxide layer and a high-k dielectric layer subsequently formed on top and side surfaces of the fin structure between the source and the drain;
    a gate structure formed on the high-k dielectric layer;
    a channel formed in the fin structure between the source and the drain below the high-k dielectric layer; wherein, the bottom N-type doped region of the source, the drain, the channel, the high-k dielectric layer and the gate structure on the surface of the sidewall of the fin structure form a MOS FINFET device; the top P-type doped region of the source, the drain, the channel, the high-k dielectric layer and the gate structure on the top surface of the fin structure form a TFET device.

2. The FINFET device integrated with a TFET of claim 1, wherein the gate structure is made of a conductive metal.

3. The FINFET device integrated with a TFET of claim 2, wherein a work function of the conductive metal is between 2 eV and 5 eV.

4. The FINFET device integrated with a TFET of claim 2, wherein a width of the fin structure is between 5 nm and 20 nm.

5. The FINFET device integrated with a TFET of claim 4, wherein a ratio of a thickness of the top P-type doped region and a thickness of the bottom N-type doped region is between 1:2 and 1:5.

6. A manufacturing method for the FINFET device integrated with the TFET according to claim 1 comprising:
    S01: forming the fin structure on the semiconductor substrate;
    S02: forming the oxide layer and the polysilicon gate structure on the fin structure; wherein the polysilicon gate structure and the oxide layer have the same pattern as the high-k dielectric layer to be formed later;
    S03: performing N-type ion implanting to two end portions of the fin structure to from an N-type doped drain and an N-type doped source;
    S04: forming a mask covering the semiconductor substrate outside the N-type doped source and performing P-type ion implanting to the N-type doped source to form the top P-type doped region, wherein the other N-type doped source below the P-type doped region forms the bottom N-type doped region;
    S05: removing the polysilicon gate structure;
    S06: forming a high-k dielectric material and a gate material on the fin structure and patterning the high-k dielectric material and the gate material to form the high-k dielectric layer and the gate structure.

7. The manufacturing method of claim 6, wherein during the P-type ion implanting, ions are implanted to the source from all sides above the source.

8. The manufacturing method of claim 7, wherein in S04, an angle between a direction of the P-type ion implanting and a horizontal direction is greater than an arctan of a total thickness of the oxide layer, the high-k dielectric layer, the gate structure and a lateral length of the source.

9. The manufacturing method of claim 8, wherein the angle between the direction of the P-type ion implanting and the horizontal direction is greater than 45°.

10. The manufacturing method of claim 7, wherein a ratio of a thickness of the top P-type doped region and a thickness of the bottom N-type doped region is between 1:2 and 1:5.

* * * * *